(12) United States Patent
Li et al.

(10) Patent No.: US 12,532,496 B2
(45) Date of Patent: Jan. 20, 2026

(54) FIELD EFFECT TRANSISTOR AND METHOD FOR MAKING THE SAME

(71) Applicants: Tsinghua University, Beijing (CN); HON HAI PRECISION INDUSTRY CO., LTD., New Taipei (TW)

(72) Inventors: Xuan-Zhang Li, Beijing (CN); Yang Wei, Beijing (CN); Shou-Shan Fan, Beijing (CN); Yue-Gang Zhang, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 414 days.

(21) Appl. No.: 18/129,004

(22) Filed: Mar. 30, 2023

(65) Prior Publication Data
US 2024/0047565 A1   Feb. 8, 2024

(30) Foreign Application Priority Data
Jul. 28, 2022   (CN) .......................... 202210900736.9

(51) Int. Cl.
| | |
|---|---|
| *H01L 29/775* | (2006.01) |
| *H01L 29/06* | (2006.01) |
| *H01L 29/66* | (2006.01) |
| *H01L 29/786* | (2006.01) |
| *H10D 30/01* | (2025.01) |
| *H10D 30/43* | (2025.01) |
| *H10D 30/67* | (2025.01) |
| *H10D 62/10* | (2025.01) |

(52) U.S. Cl.
CPC .......... *H10D 30/43* (2025.01); *H10D 30/031* (2025.01); *H10D 30/6757* (2025.01); *H10D 62/121* (2025.01)

(58) Field of Classification Search
CPC .. H10D 30/43; H10D 30/031; H10D 30/6757; H10D 62/121; H10D 30/47; H10D 30/67; H10D 30/675; H10D 99/00; H10D 64/251; H10D 64/62; B82Y 10/00; H10K 85/221; H01L 21/34
USPC ......................................... 257/288
See application file for complete search history.

(56) References Cited

U.S. PATENT DOCUMENTS

| | | |
|---|---|---|
| 11,069,868 B2 | 7/2021 | Zhang et al. |
| 11,362,180 B2 | 6/2022 | Wang et al. |
| 2018/0114931 A1* | 4/2018 | Tian ........................ H10K 71/60 |
| 2021/0193801 A1* | 6/2021 | Wang ..................... H10D 64/01 |

FOREIGN PATENT DOCUMENTS

| | | |
|---|---|---|
| TW | 202017219 | 5/2020 |
| TW | 202125818 | 7/2021 |

* cited by examiner

*Primary Examiner* — Tong-Ho Kim
(74) *Attorney, Agent, or Firm* — ScienBiziP, P.C.

(57) ABSTRACT

A field effect transistor includes a gate electrode, an insulating layer, a source electrode, a drain electrode, and a channel layer. The insulating layer is located on the surface of the gate electrode, and the channel layer is located on the surface of the insulating layer away from the gate electrode. The source electrode and the drain electrode are spaced apart from each on the surface of the channel layer away from the insulating layer. The source electrode and the drain electrode are one-dimensional structures. The present application further provides a method for making the field effect transistor.

15 Claims, 12 Drawing Sheets

FIELD EFFECT TRANSISTOR AND
// METHOD FOR MAKING THE SAME

FIELD

The present application relates to a field effect transistor and a method for making the field effect transistor.

BACKGROUND

The ultimate miniaturization of transistors is the unremitting pursuit of the integrated circuit industry. Shrinking the channel length and the contact length is necessary to reduce the size of the overall device. The two-dimensional semiconductor shows great potential in reducing the channel length, which is due to the ultrathin atomic structure of the two-dimensional semiconductor effectively suppresses the short channel effect. Therefore, the field effect transistor (FET) with shorter gate length can be developed using the two-dimensional semiconductor. However, shortening the contact length will cause an increase in the contact resistance, and will also lead to the deterioration of the conductivity of the contact material itself. For a traditional three-dimensional metal, when the contact length is reduced to less than 10 nm, the metal wire will have severe crystal domaining phenomenon, and the resistivity will be significantly improved; for a two-dimensional semi-metal such as graphene, reducing the contact length to less than 10 nm will lead to additional quantization and severe edge scattering. These limitations will make the contact performance of the field effect transistor worse. Therefore, achieving ultra-short contact length and low contact resistance in high performance two-dimensional field effect transistor remains a great challenge.

Therefore, there is room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
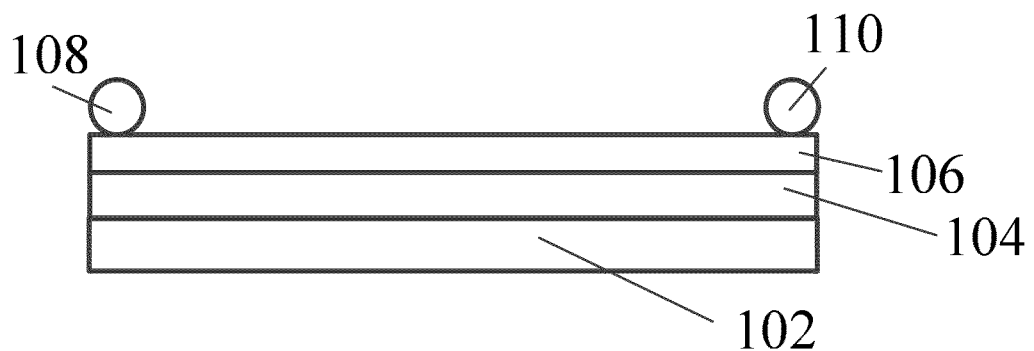
FIG. 1 shows a schematic view of a field effect transistor provided by the present application.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale, and the proportions of certain parts may be exaggerated better illustrate details and features. The description is not to be considered as limiting the scope of the embodiments described herein.

The term "outside" refers to a region that is beyond the outermost confines of a physical object. The term "inside" indicates that at least a portion of a region is partially contained within a boundary formed by the object. The term "substantially" is defined to essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like. It should be noted that references to "an" or "one" embodiment in this disclosure are not necessarily to the same embodiment, and such references mean at least one.

Referring to FIG. 1, a field effect transistor 100 of a first embodiment is provided. The field effect transistor 100 includes a gate electrode 102, an insulating layer 104, a source electrode 108, a drain electrode 110, and a channel layer 106. The insulating layer 104 is located on the surface of the gate electrode 102, and the channel layer 106 is located on the surface of the insulating layer 104 away from the gate electrode 102. The source electrode 108 and the drain electrode 110 are spaced apart from each other and on the surface of the channel layer 106 away from the insulating layer 104.

The material of the gate electrode 102 has good conductivity. Specifically, the material of the gate electrode 102 can be conductive materials, such as a metal, an alloy, an indium tin oxide (ITO), an antimony tin oxide (ATO), a conductive silver paste, a conductive polymer, or a carbon nanotube film. The metal or alloy can be aluminum, copper, tungsten, molybdenum, gold or alloys thereof. Specifically, the thickness of the gate electrode 102 is in a range from 0.5 nanometers to 100 micrometers. In one embodiment, the gate electrode 102 is made of highly doped silicon (silicon highly doped is conductive).

The material of the insulating layer 104 can be a rigid material such as silicon nitride or silicon oxide, or a flexible material such as benzocyclobutene (BCB), polyester or acrylic resin. According to different types of material of the insulating layer 104, the insulating layer 104 can be formed by different methods. Specifically, when the material of the insulating layer 104 is silicon nitride or silicon oxide, the insulating layer 104 can be formed by a deposition method. When the material of the insulating layer 104 is benzocyclobutene (BCB), polyester or acrylic resin, the insulating layer 104 can be formed by a method of printing and coating. The thickness of the insulating layer 104 is in a range from 0.5 nanometers to 100 micrometers. In one embodiment, the surface of the highly doped silicon has an oxide layer with a thickness of 300 nm (nanometer), the oxide layer is made of $SiO_2$ (silicon dioxide), and the oxide layer is the insulating layer 104.

The channel layer 106 is a two-dimensional semiconductor structure, such as a two-dimensional semiconductor material such as molybdenum disulfide ($MoS_2$) film, tungsten disulfide ($WS_2$) film, or tungsten diselenide ($WSe_2$) film. The material of the molybdenum disulfide ($MoS_2$) film is the molybdenum disulfide ($MoS_2$). The material of the tungsten disulfide ($WS_2$) film is the tungsten disulfide ($WS_2$). The material of the tungsten diselenide ($WSe_2$) film is the tungsten diselenide ($WSe_2$).

The materials of the source electrode 108 and the drain electrode 110 should have good conductivity, and the source electrode 108 and the drain electrode 110 are one-dimensional structures. One-dimensional (1D) structures are those with a dimension within the range between 1 nm and 100 nm. Specifically, the materials of the source electrode 108 and the drain electrode 110 can be conductive materials, such as a metal, an alloy, ITO, ATO, a conductive silver paste, a conductive polymer, or a metallic carbon nanotube. Specifically, when the material of the source electrode 108 and the drain electrode 110 is the metal, the alloy, the ITO or the ATO, the source electrode 108 and the drain electrode 110 can be formed by methods such as evaporation, sputtering, deposition, masking and etching. When the material of the source electrode 108 and the drain electrode 110 is conductive silver paste, the conductive polymer or the carbon nanotube, the conductive silver paste or the carbon nanotube can be coated or adhered on the surface of the insulating layer 104 away from the gate electrode 102 by printing coating or direct adhesion method, so that the source electrode 108 and the drain electrode 110 are formed. The thickness of the source electrode 108 and the drain electrode 110 is in a range from 0.5 nanometers to 100 micrometers, and the distance between the source electrode 108 and the drain electrode 110 is in a range from 10 nanometers to 800 nanometers. In some embodiments, each of the source electrode 108 and the drain electrode 110 is a single metallic single-walled carbon nanotube (SWCNT), and the distance between the source electrode 108 and the drain electrode 110 is 150 nanometers.

The field effect transistor 100 can further include an insulating substrate, and the insulating substrate supports the gate electrode 102. That is, the insulating layer 104 is located on the surface of the gate electrode 102 away from the insulating substrate. The material of the insulating substrate can be selected from the hard material, such as glass, quartz, ceramic, diamond, silicon wafer, and so on; or flexible material, such as plastic or resin. In one embodiment, the material of the insulating substrate is glass. The insulating substrate can also be a substrate in a large scale integrated circuit, and a plurality of back-gate field effect transistors 100 can be integrated on the same insulating substrate according to a predetermined rule or pattern.

The field effect transistor 100 further includes a plurality of electrodes, and the plurality of electrodes is respectively disposed on the channel layer 106, the source electrode 108 and the drain electrode 110. The plurality of electrodes is spaced apart from each other, and the distances between adjacent electrodes are not equal. The electrodes are all composed of the conductive material, and the conductive material can be selected from the metal, the ITO, the ATO, the conductive silver glue, the conductive polymer, or the conductive carbon nanotube. The metal material may be aluminum, copper, tungsten, molybdenum, gold, titanium, palladium or any combination of alloys. The electrode can also be a conductive film, and the thickness of the conductive film is in a range from 0.01 μm to 10 μm. In one embodiment, the electrode is an Au/Ti (gold/titanium, thickness 50 nm/5 nm) electrode. The Au/Ti electrode is formed by stacking a 50 nm thick gold layer and a 5 nm thick titanium layer. The layer is located on the upper surface of the Ti layer, the Ti layer is used as an adhesion layer, and the Au layer is used as a conductive layer. The electrodes can be provided by methods of evaporation, sputtering, deposition, masking, etching, print coating or direct adhesion.

Figure 2:
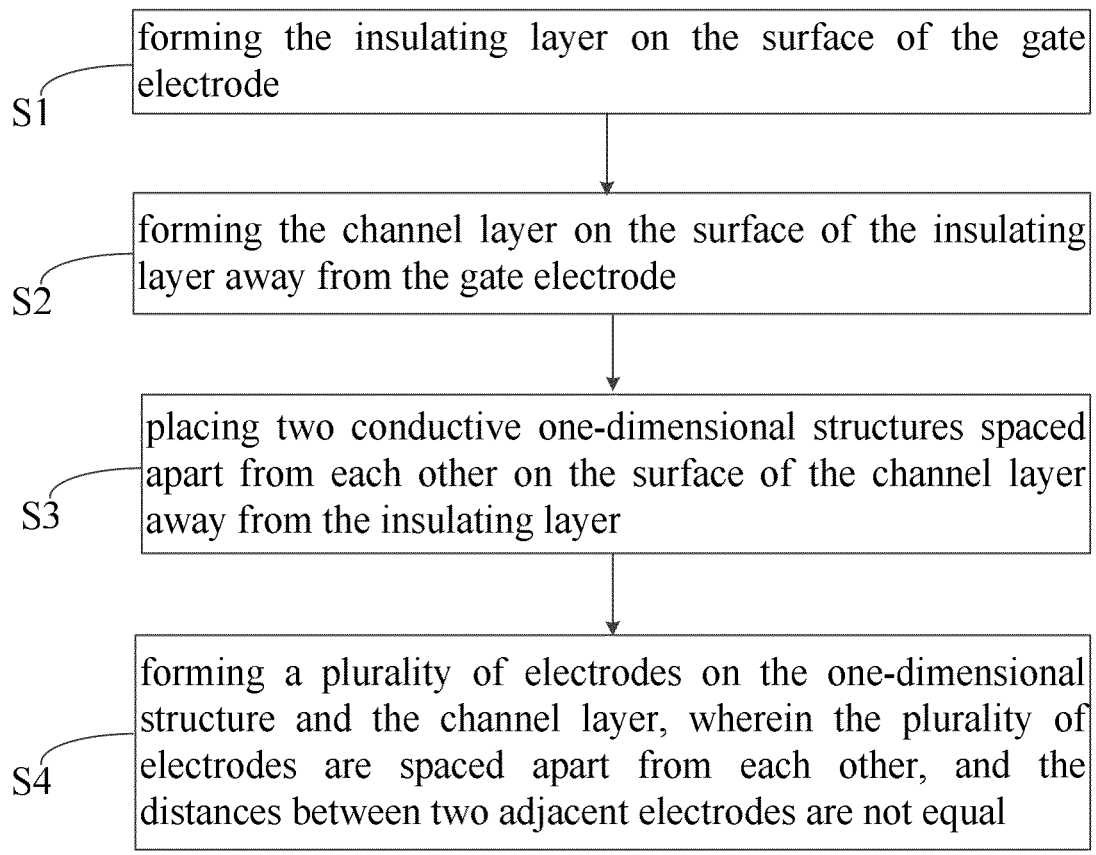
FIG. 2 shows a flowchart of a method for making the field effect transistor of FIG. 1.

Referring to FIG. 2, a method for making the field effect transistor 100 of the first embodiment is provided, and the method includes the following steps:

S1, forming the insulating layer 104 on the surface of the gate electrode 102;

S2, forming the channel layer 106 on the surface of the insulating layer 104 away from the gate electrode 102;

S3, placing two conductive one-dimensional structures spaced apart from each other on the surface of the channel layer 106 away from the insulating layer 104; and S4, forming a plurality of electrodes on the one-dimensional structure and the channel layer 106, wherein the plurality of electrodes are spaced apart from each other, and the distances between two adjacent electrodes are not equal.

The method for making the field effect transistor 100 can further include the step of disposing the gate electrode 102 on the insulating substrate. The insulating substrate can be a substrate in a large scale integrated circuit.

During step S1, the insulating layer 104 can be formed on the surface of the gate electrode 102 by means of sputtering, vapor deposition, direct layering, or the like.

During step S2, the channel layer 106 can be formed on the surface of the insulating layer 104 away from the gate electrode 102 by means of sputtering, vapor deposition, directly layering, or the like. In one embodiment, the two-dimensional semiconductor material is directly deposited on the surface of the insulating layer 104 away from the gate electrode 102.

During step S3, the conductive one-dimensional structures are used as the source electrode 108 and the drain electrode 110, respectively. The material of the conductive one-dimensional structure is the same as the material of the source electrode 108 and the drain electrode 110 described in the first embodiment.

In one specific embodiment, the conductive one-dimensional structure is a single metallic SWCNT, and the method for making the single metallic SWCNT includes the following steps:

S31, growing CNTs (carbon nanotubes);

S32, placing the CNTs in the sulfur vapor, wherein the sulfur vapor forms sulfur particles on the CNTs the sparser the sulfur particles are distributed, the smaller the diameter of the CNTs are, so that SWCNTs are selected from the CNTs;

S33, judging the conductivity of the selected SWCNT, thereby obtaining the metallic SWCNT; and S34, annealing to remove the sulfur particles on the CNTs.

During step S31, the method for growing CNTs is not limited, such as chemical vapor deposition method and the like. The process of horizontally growing CNTs from a growth substrate is described in detail below by taking the "kite flying method" as an example, but is not limited thereto.

Figure 3:
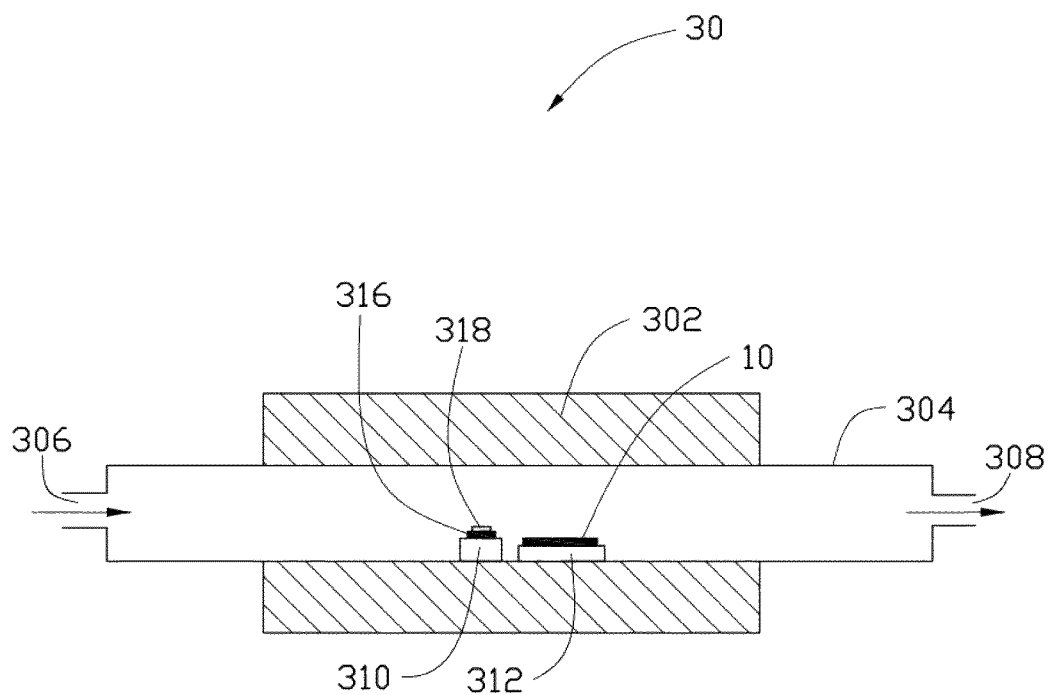
FIG. 3 shows a schematic view of a device for making carbon nanotubes.

Referring to FIG. 3, the method for growing CNTs by the "kite flying method" includes the following steps:

S311, providing a growth device 30;

S312, providing a growth substrate 316 and a substrate 10, and a monodisperse catalyst layer 318 is formed on the surface of the growth substrate 316;

S313, placing the growth substrate 316 on the fixed platform 310, wherein the substrate 10 is placed on a rotatable platform 312;

S314, supplying the carbon source gas to grow CNTs along the gas flow direction; and S315, stopping supplying the carbon source gas, so that CNTs are formed on the surface of the substrate 10, and CNTs are in parallel and spaced apart from each other.

During step S1, The growth device 30 includes a heating furnace 302, a reaction chamber 304, a rotatable platform 312, and a fixed platform 310 corresponding to the rotatable platform 312. The rotatable platform 312 and the fixed platform 310 are spaced apart from each other and are in the reaction chamber 304. The reaction chamber 304 includes a gas inlet 306 and a gas outlet 308. The fixed platform 310 is close to the gas inlet 306, and the rotatable platform 312 is close to the gas outlet 308. The distance between the rotatable platform 312 and the fixed platform 310 is less than 1 cm, and the rotatable platform 312 is slightly lower than the fixed platform 310. The rotatable platform 312 can be rotated at any angle in the horizontal direction.

During step S312, when the alloy material of iron, cobalt, nickel or any combination thereof is used to prepare the catalyst layer 318, the alloy material can be deposited on the surface of the growth substrate 316 by using a thin film technology. When a metal salt is selected to prepare the catalyst layer 318, the monodisperse solution of the metal salt or the monodisperse solution of the metal is coated on the growth substrate 316 to form the catalyst layer 318. In one embodiment, the monodisperse solution of metal-salt can be selected from the group comprising a solution of $Fe(NO_3)_3$ and water, solution of $CuCl_2$ and water, solution of $FeCl_3$ and water, solution of $Fe(NO_3)_3$ and ethanol, solution of $CuCl_2$ and ethanol, and solution of $FeCl_3$ and ethanol. The monodisperse solution of metal is selected from the group comprising a solution of Fe—Mo and n-octane, solution of Fe—Co and n-octane, solution of Fe—Ru and n-octane, solution of Fe—Mo and hexane, solution of Fe—Co and hexane, solution of Fe—Ru and hexane, solution of Fe—Mo and ethanol, solution Fe—Co and ethanol, and solution of Fe—Ru and ethanol. In one embodiment, the catalyst layer 318 is formed by a solution of $Fe(NO_3)_3$ and ethanol. Using a monodisperse solution to prepare the catalyst layer 318 is beneficial to avoid the catalyst materials to gather together. Thus, the catalyst layer 318 includes a plurality of monodisperse catalyst particles.

During step S313, the growth substrate 316 is placed on the fixed platform 310 to ensure that the surface of the growth substrate 316 on which the catalyst layer 318 is deposited faces upward. The growth substrate 316 and the substrate 10 are high temperature resistant substrates, and the materials thereof are not limited, as long as the melting point is ensured to be higher than the growth temperature of the carbon nanotubes. In one embodiment, the growth substrate 316 is a strip-shaped silicon wafer with a length of 10 cm and a width of 0.5 mm. It can be understood that in this embodiment, the catalyst material can be deposited on the surface of the silicon wafer with a large area, and then the silicon wafer can be cut into a plurality of growth substrates 316 of predetermined size.

During step S314, the carbon source gas is supplied, and the process of growing CNTs along the gas flow direction includes the following steps:

S3141, supplying a protective gas into the reaction chamber 304 to evacuate the air in the reaction chamber 304, wherein the protective gas is nitrogen or an inert gas, and the protective gas in one embodiment is argon;

S3142, heating the reaction chamber 304 to the growth temperature of CNTs under a protective gas environment, and maintaining the growth temperature; wherein the growth temperature of the CNTs is in a range from 800° C. to 1000° C. It can be understood that the growth temperature of CNTs is different according to different carbon source gases. In one embodiment, when ethanol is used as the carbon source gas, the growth temperature of the CNTs is in a range from 850° C. to 950° C. When methane is used as the carbon source gas, the growth temperature of the CNTs is in a range from 950° C. to 1000° C.; and S3143, supplying the carbon source gas to grow CNTs, wherein the carbon source gas can be selected from hydrocarbons with relatively active chemical properties such as ethanol, acetylene, ethylene, and methane; the carbon source gas in one embodiment is ethanol or methane, the flow rate of the carbon source gas is in a range from 5 sccm (standard state ml/min) to 100 sccm, the carbon source gas is mixed with a certain amount of hydrogen as the carrier gas, and the flow ratio of the carbon source gas to the carrier gas is in a range from 1:1 to 1:3.

After supplying the carbon source gas into the reaction chamber 304, it starts to grow carbon nanotubes under the effect of the catalyst. One end (i.e., the root) of the carbon nanotubes is fixed on the growth substrate 316, and the other end (i.e., the top/free end) of the carbon nanotubes grow continuously. The density of the carbon nanotubes is low due to the catalyst layer 318 including the plurality of monodisperse catalyst grain. Therefore, a part of the carbon nanotubes grow into SWCNTs. Since the growth substrate 316 on the fixed platform 310 is close to the gas inlet 306 of the reaction chamber 304, when the carbon source gas is continuously introduced, the SWCNTs float above the substrate 10 with the roots of the SWCNTs still sticking on the growth substrate 316. The mechanism of growing SWCNTs is called "kite-flying mechanism". The growth time of CNTs is related to the CNTs to be prepared. In one embodiment, the growth time is 10 minutes. The length of CNTs grown by this method is more than 1 cm, and can even reach more than 30 cm.

Figure 4:
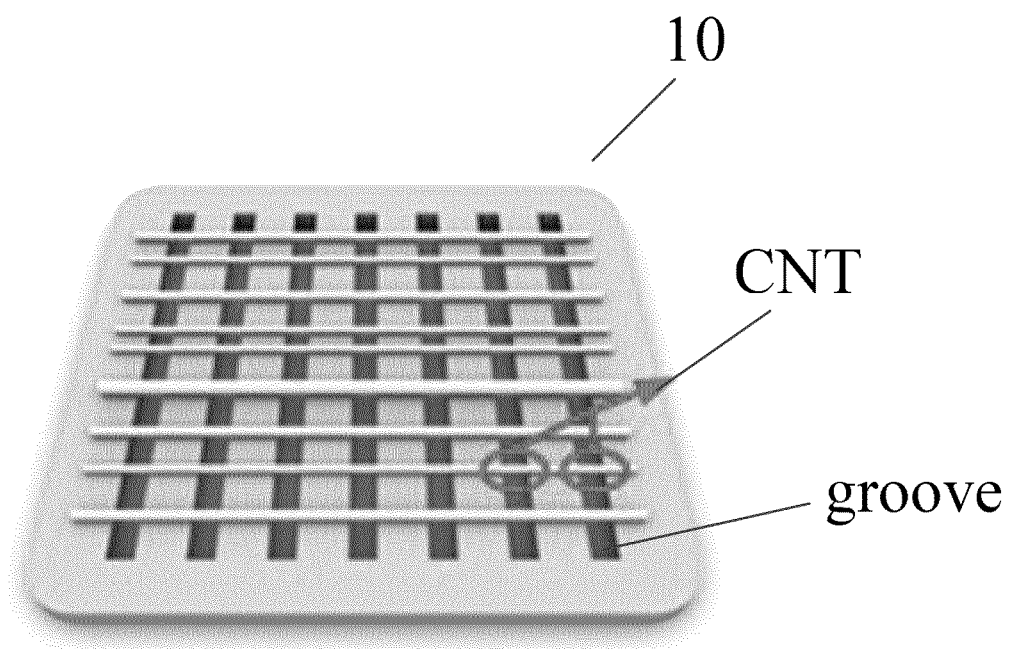
FIG. 4 shows a schematic view of the carbon nanotubes falling horizontally onto a substrate having a plurality of grooves.

During step S315, after stop supplying the carbon source gas, the CNTs stop growing. At the same time, stop heating and cool down. However, the protective gas should continue to supply until the temperature of the reaction chamber 304 drops to room temperature to prevent the grown CNTs from being oxidized. When the supply of the carbon source gas is stopped, the CNTs stop growing. The CNTs are formed on the substrate 10 in parallel and spaced apart from each other, and the distance between two adjacent CNTs is greater than 20 microns. In order to separating CNTs from the substrate 10, the substrate 10 can be etched with a plurality of grooves arranged at intervals in advance. When the CNTs are located on the substrate 10, the CNTs are suspended on the grooves, as shown in FIG. 4. In one embodiment, the material of the substrate 10 is composed of silicon and silicon nitride.

During step S32, in one embodiment, the sulfur powder is heated to 150° C., to form sulfur vapor, and then the substrate 10 with CNTs of the step S11 is placed in the sulfur vapor for a period of time, and many sulfur particles can be formed on the outer surface of the CNT. That is, the sulfur particles are distributed on the outer surface of the CNT. The condensed morphology of sulfur vapor on CNTs depends on the diameter of the CNT, and the sparser the distribution of sulfur particles, the smaller the diameter of the CNTs. Under the optical microscope, the CNT with the most sparse distribution of sulfur particles can be selected, which is the single-walled carbon nanotube (SWCNT).

During step S33, the metallic SWCNTs are selected by detecting the conductivity of the SWCNTs. In one embodiment, under a voltage of 1V (volt), when the current of the SWCNT is greater than or equal to 1 nA (nanoampere), the SWCNT is a metallic SWCNT.

During step S34, the annealing temperature is in a range from 300° C. to 400° C., to remove the sulfur particles on the CNTs. In one embodiment, the annealing temperature is in a range from 300° C. to 350° C.

Hereinafter, an example I is used to describe the method for making the field effect transistor 100, but it is not limited thereto.

Example I

The method for making the field effect transistor 100 includes the following steps.

In the first step, the $MoS_2$ film (as the channel layer 106) is placed on the highly doped silicon wafer (as the gate electrode 102), the surface of the highly doped silicon wafer has 300 nm thick $SiO_2$ (as the insulating layer 104), and the $SiO_2$ is located between the $MoS_2$ film and the highly doped silicon wafer.

In the second step, the ultra-long CNTs grow by "kite-flying method" using chemical vapor deposition method. The 0.2 nm thick iron electron beam is deposited on the silicon substrate, the temperature of the reaction furnace is set to 970° C. The $H_2$ with the flow rate of 200 sccm is as the reducing gas, and the $C_2H_4$ with the flow rate of 1 sccm is as the carbon source, so that CNTs grow. The substrate 10 used for collecting the suspended-grown CNTs is a Si/SiNx substrate, and the Si/SiNx substrate defines seven grooves, and the wide of each groove is 200 microns.

In the third step, the metallic SWCNTs are selected. The sulfur powders are heated to 150° C. by a hot plate for evaporation, and then the ultra-long CNTs placed on the Si/SiN substrate are treated in a sulfur atmosphere for 10 seconds. Sulfur vapor is deposited on the CNT surface to form sulfur particles, which can be efficiently tracked using the optical microscopy. The condensed morphology of sulfur vapor on CNTs depends on the diameter of the CNTs, and the sparser the distribution of sulfur particles, the smaller the diameter of the CNTs. Under the optical microscope, the CNT with the sulfur particles of most sparse distribution is selected, and the CNT with the sulfur particles of most sparse distribution is a single-walled carbon nanotube (SWCNT). And then a power meter (such as the tungsten tip of a Keithley 2900 high-precision power meter) is connected to determine the conductivity of the SWCNT. When the current of the SWCNT is greater than or equal to 1 nanoampere under a voltage of 1V, the SWCNT is metallic, which is also called metallic SWCNT.

In the fourth step, two metallic SWCNTs selected in the third step are arranged at intervals on the surface of the $MoS_2$ film away from the highly doped silicon wafer.

In the fifth step, the annealing treatment is performed, and the annealing temperature is 350° C., to remove the sulfur particles on the surface of the metallic CNT.

In the sixth step, patterned Ti/Au (5 nm/50 nm) electrodes are fabricated by the electron beam lithography, the electron beam evaporation and the lift-off steps. The Ti/Au (5 nm/50 nm) electrodes are composite structures of titanium and gold. In detail, Au is formed on the surface of Ti, the thickness of Ti is 5 nm, and the thickness of Au is 50 nm. The Ti/Au (5 nm/50 nm) electrodes are respectively disposed at two opposite ends of the $MoS_2$ film and two opposite ends of the metallic SWCNT.

The performance of the field effect transistor 100 prepared in the example I is characterized below.

Figure 5:
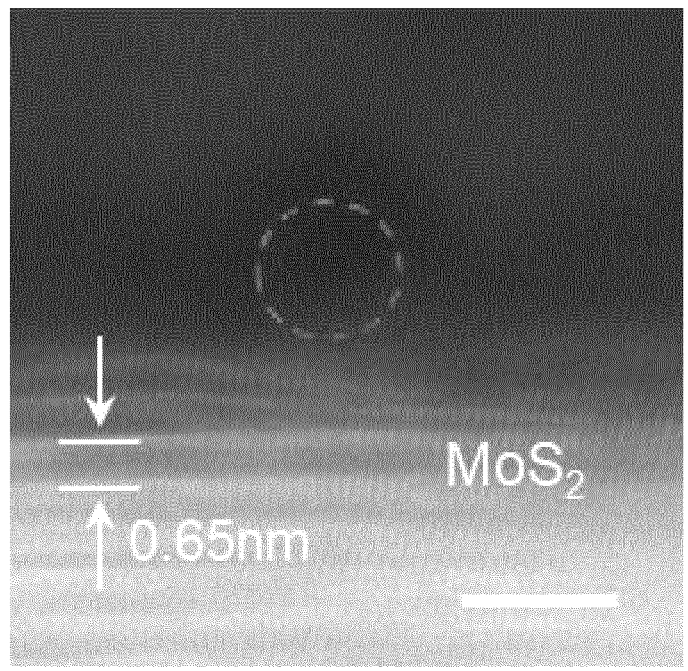
FIG. 5 shows a transmission electron microscope (TEM) image of a cross-section of a whole structure formed by a source electrode and a drain electrode located on a channel layer.
Figure 6:
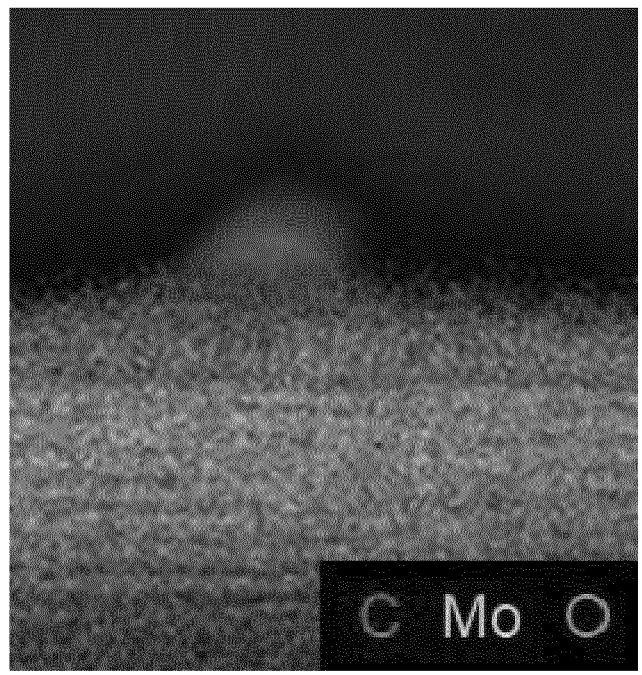
FIG. 6 shows an electron energy loss spectroscopy (EELS) of the whole structure formed by the source electrode and the drain electrode located on the channel layer.

FIG. 5 shows a transmission electron microscope (TEM) image of the cross-section of the whole structure formed by the source electrode 108 and the drain electrode 110 disposed on the channel layer 106. FIG. 6 shows an electron energy loss spectroscopy (EELS) of the whole structure formed by the source electrode 108 and the drain electrode 110 disposed on the channel layer 106. A layered structure can be seen from FIG. 5, the lower layer is the $MoS_2$ film, and the upper layer is the metallic SWCNT, which proves that the channel layer 106 is the $MoS_2$ film, and the source electrode 108 and the drain electrode 110 are both metallic SWCNTs. It can be seen from FIG. 6 that the whole structure formed by the source electrode 108 and the drain electrode 110 disposed on the channel layer 106 contains three elements: carbon (C), Mo (molybdenum), and oxygen (O), which can further prove that the channel layer 106 is the $MoS_2$ film, and both the source electrode 108 and the drain electrode 110 are metallic SWCNTs.

Figure 7:
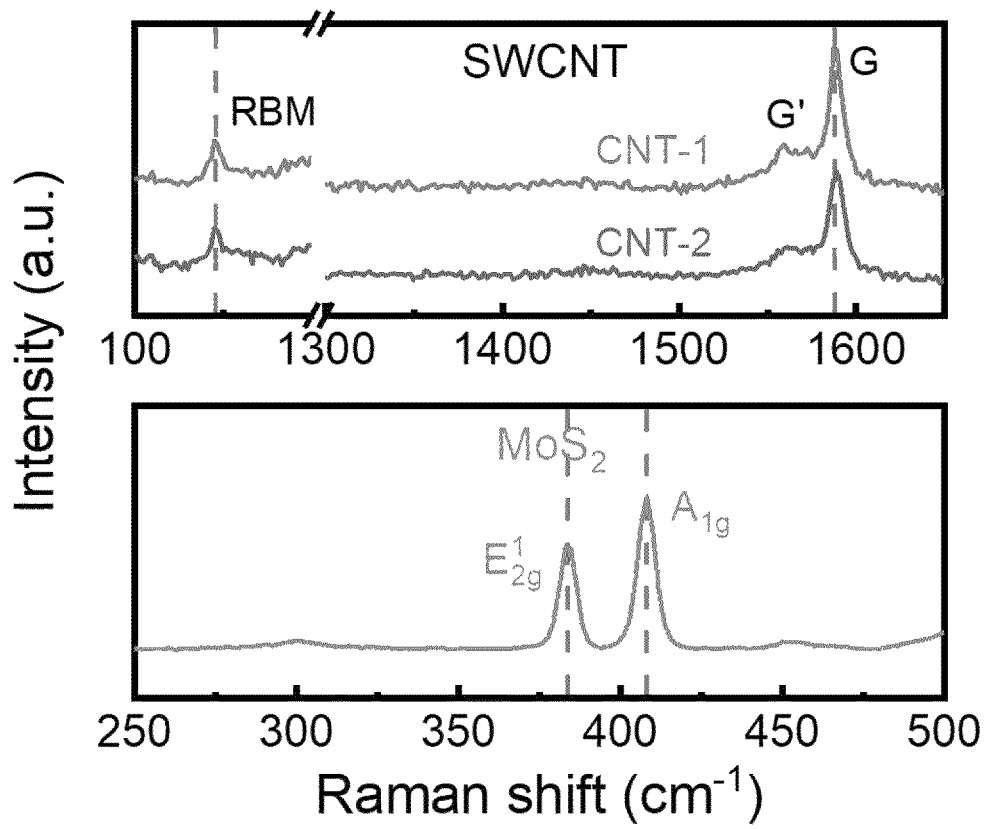
FIG. 7 shows a Raman spectrum of the whole structure formed by the source electrode and the drain electrode located on the channel layer.

FIG. 7 is a Raman spectrum of the whole structure formed by the source electrode 108 and the drain electrode 110 located on the channel layer 106. It can be seen from FIG. 7 that typical SWCNT peaks appear in the Raman spectrum of the source electrode 108 and the drain electrode 110, indicating that the source electrode 108 and the drain electrode 110 are SWCNTs with the same chirality. A typical $MoS_2$ peak appears in the Raman spectrum of the channel layer 106, indicating that the material of the channel layer 106 is $MoS_2$.

Figure 8:
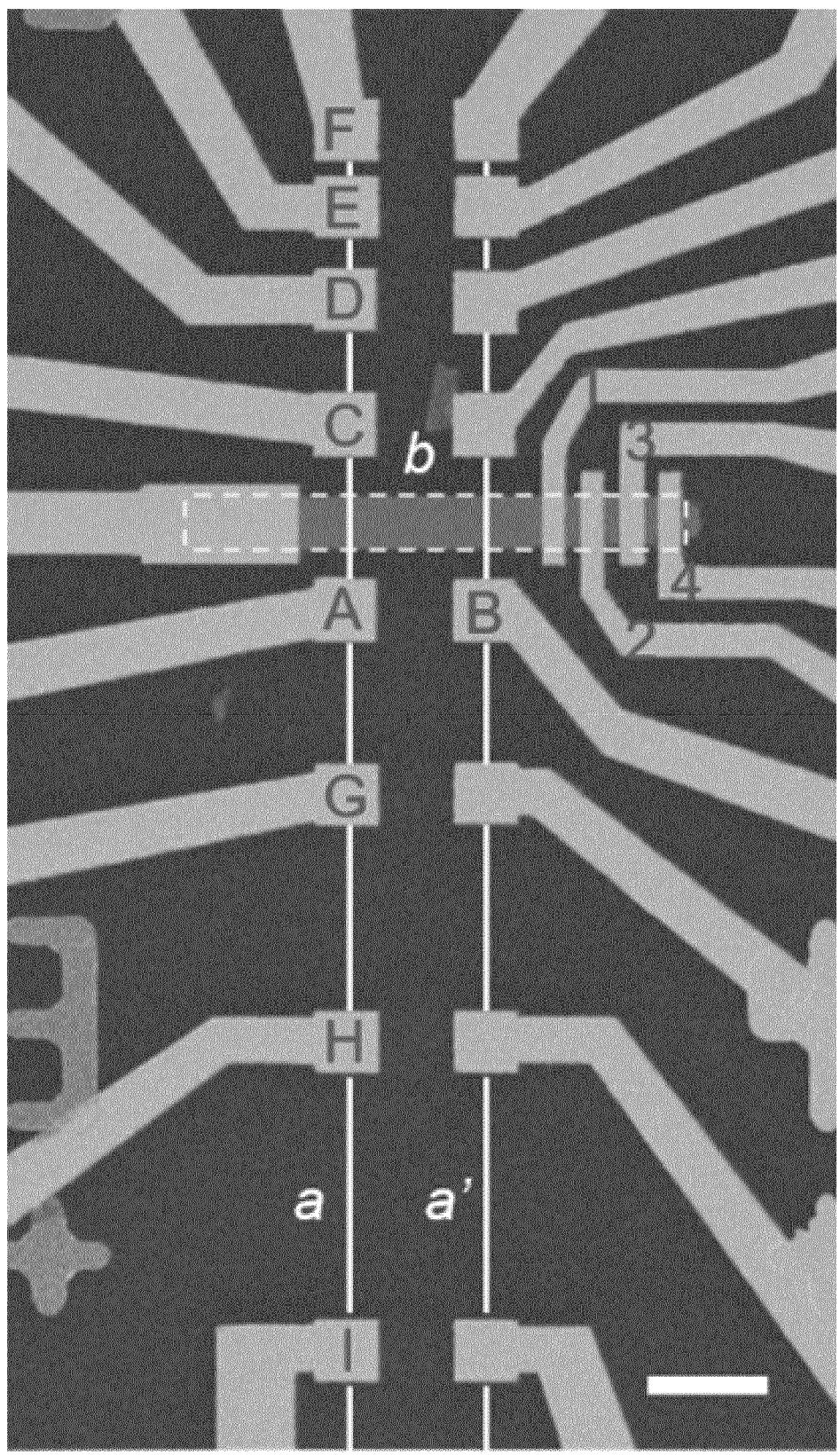
FIG. 8 shows a false-colored scanning electron microscope (false-colored SEM) image of the field effect transistor of FIG. 1.
Figure 9:
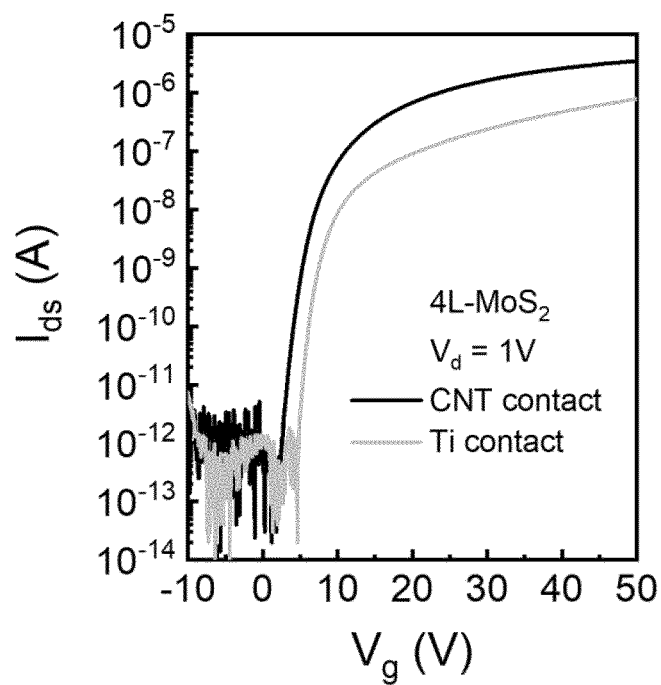
FIG. 9 shows the transfer characteristics between a point A and a point B as indicated in FIG. 8.
Figure 10:
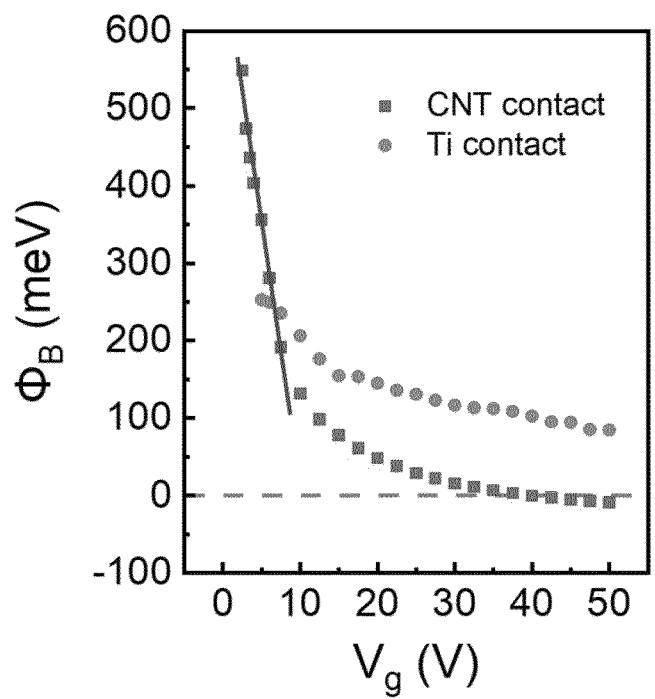
FIG. 10 shows the barrier heights of an interface between the metallic SWCNT and $MoS_2$, and an interface between the Au/Ti electrode and $MoS_2$ in FIG. 8 at different gate voltages.

FIG. 8 is a false-colored scanning electron microscope (false-colored SEM) photograph of the field effect transistor 100. In FIG. 8, the bright ribbons represent electrodes disposed on the channel layer 106, the source electrode 108, and the drain electrode 110. The transfer characteristics between the two metallic SWCNTs in FIG. 8 (that is, the transfer characteristics between points A and B in FIG. 8) are tested, and the transfer characteristics between the Au/Ti electrodes in FIG. 8 (that is, the transfer characteristics between the point 1 and the point 2 in FIG. 8) are tested. FIG. 9 shows the transfer characteristics between points A and B in FIG. 8. It can be seen from FIG. 9 that the metallic SWCNT contact with a contact length of 2 nm has a larger on-state current than the Au/Ti electrode contact with a length of 3 m, wherein the 2 nm contact length refers to the diameter of the metallic SWCNT being 2 nm, that is, the contact length is the diameter of the metallic SWCNT. FIG. 10 shows the barrier heights of an interface between the metallic SWCNT and MoS$_2$, and an interface between the Au/Ti electrode and MoS$_2$ in FIG. 8 at different gate voltages. It can be seen from FIG. 10 that the interfacial barrier between SWCNTs and MoS$_2$ films can be adjusted in a wider range (550 meV to 0), wherein meV is megaelectron volts.

Figure 11:
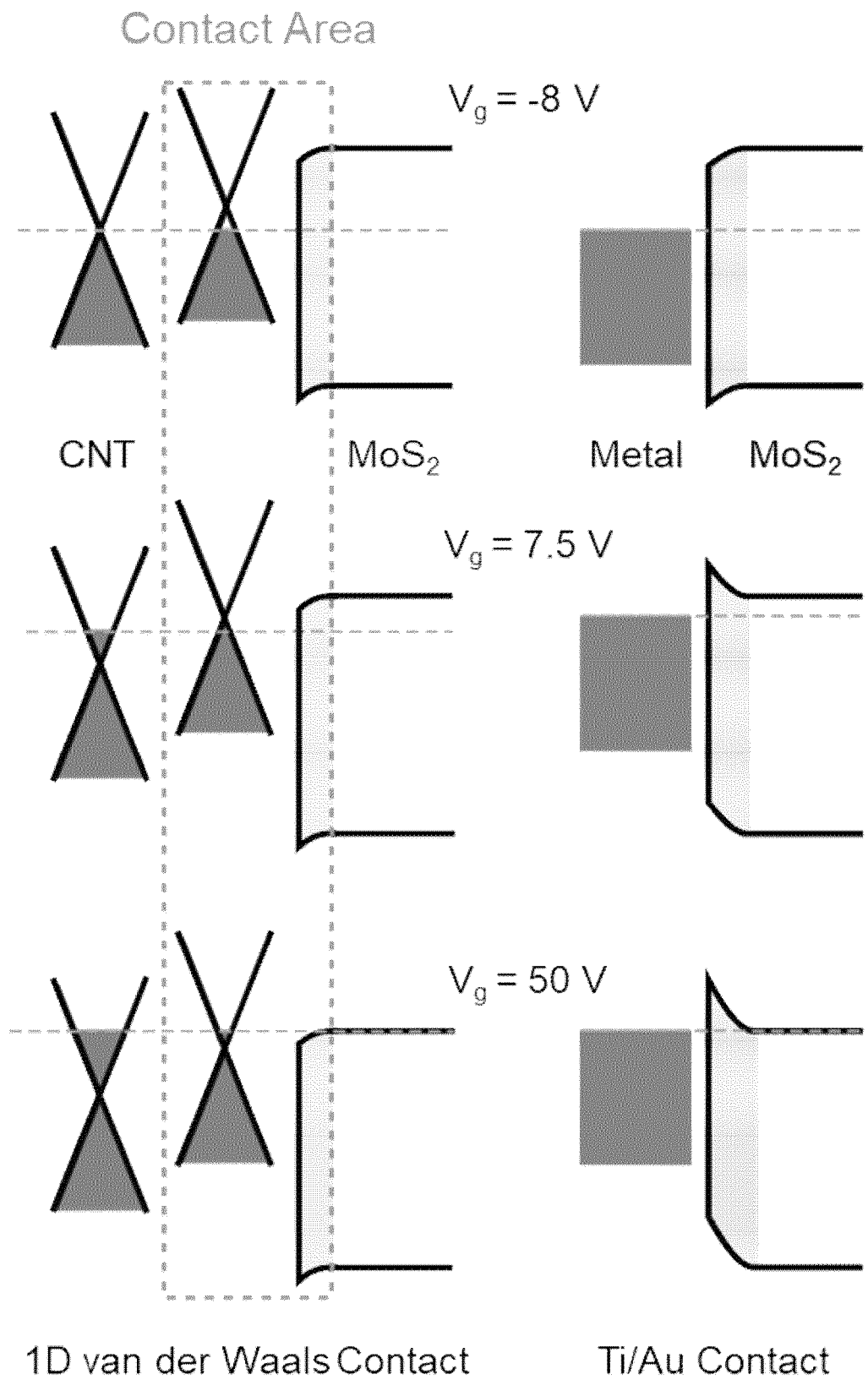
FIG. 11 shows an energy band diagram of the contact between the point A and the point B, and the contact between a point 1 and a point 2 as indicated in in FIG. 8.

FIG. 11 is a comparison of the energy band diagrams of the metallic SWCNT contact between points A and B, and the Au/Ti contact between points 1 and 2 in FIG. 8. It can be seen from FIG. 11 that the field effect transistor 100 can realize switching between the Schottky contact and the ohmic contact under the action of the gate voltage.

Figure 12:
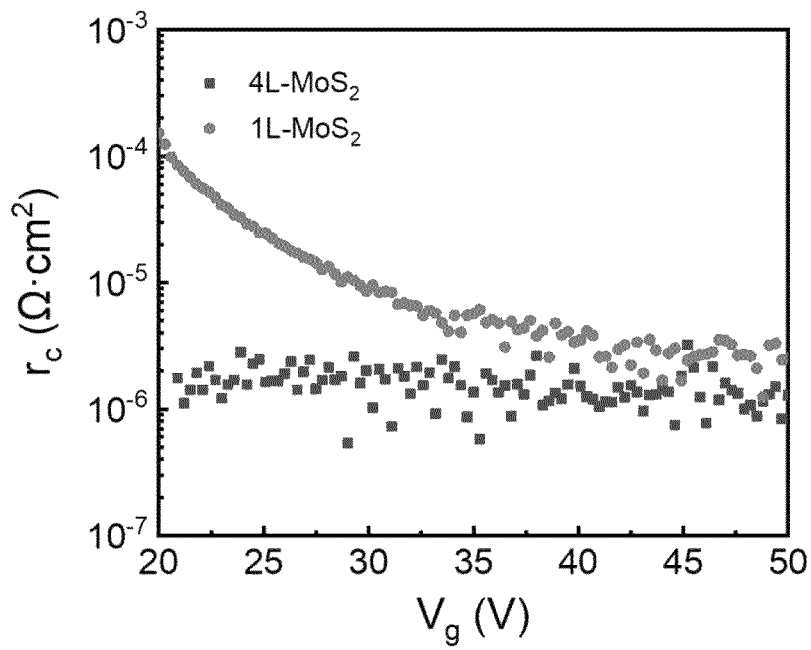
FIG. 12 shows resistivity-gate voltage diagram of an interface contact between the metallic SWCNT and the $MoS_2$ film in the field effect transistor of FIG. 1.

FIG. 12 is a resistivity-gate voltage diagram of the interface contact between the metallic SWCNT and the MoS$_2$ film in the field effect transistor 100. It can be seen from FIG. 12 that the resistivity of the ohmic contact between the metallic SWCNT and the MoS$_2$ film can be as low as $10^{-6}$ $\Omega \cdot cm^2$.

Compared with the prior art, the field effect transistor 100 and the method for making the field effect transistor 100 have the following advantages: first, the present application sets two SWCNTs with the same chirality on a two-dimensional semiconductor to provide a one-dimensional semimetallic contact, and successfully reducing the contact length of the field effect transistor 100 to 2 nm, so that the field effect transistor 100 has an ultra-short contact length; second, the field effect transistor 100 can be switched between the Schottky contact and the ohmic contact by adjusting the potential of the gate electrode 102; thirdly, in the ohmic contact mode, the resistivity and contact resistance of the interface contact between the SWCNT and the channel layer 106 are $10^{-6}$ $\Omega \cdot cm^2$ and 50 k$\Omega \cdot \mu m$, respectively, so the field effect transistor 100 has a lower contact resistance.

The second embodiment of the present application provides a method for measuring the interface resistance between the source electrode 108 (or the drain electrode 110) and the channel layer 106 in the field effect transistor 100, which includes the following steps:

S21, providing the field effect transistor 100, wherein the source electrode 108 and the drain electrode 110 are the metallic SWCNTs, and the channel layer 106 is a molybdenum disulfide (MoS$_2$) film, a tungsten disulfide (WS$_2$) film, a tungsten diselenide (WSe$_2$) film and other two-dimensional semiconductor materials; and a plurality of Au/Ti electrodes are respectively located on the single metallic SWCNT and the channel layer 106;

S22, forming the false-colored scanning electron microscope (false-colored SEM) image of the field effect transistor 100, as shown in FIG. 8; wherein in FIG. 8, bright ribbons A to I and 1 to 4 represent the Au/Ti electrodes, the dotted frame area b represents the channel layer 106, the two parallel white bright lines a, a' in FIG. 8 represent the metallic SWCNTs, and A to I in FIG. 8 can be understood as electrode A to electrode I, and it can also be understood that the Au/Ti electrodes are formed at point A to point I; 1 to 4 can be understood as electrode 1 to electrode 4 (or the first electrode, second electrode, the third electrode and the fourth electrode), it can also be understood that the Au/Ti electrodes are arranged at points 1 to 4;

S23, obtaining the resistivity $\rho_{CNT}^{on\ SiO2}$ ($\Omega \cdot \mu m^{-1}$) of the metallic SWCNTs on the silicon dioxide (the surface of the highly doped silicon wafer has a layer of silicon dioxide), the resistivity $\rho_{CNT}^{on\ MoS_2}$ ($\Omega \cdot \mu m^{-1}$) of the metallic SWCNTs on the MoS$_2$ film, and the interface contact resistance $R_{nc}^{CNT}$ ($\Omega$) between the metallic SWCNT and the Ti/Au electrode by the transfer length method;

S24, obtaining the sheet resistance $\rho_{TMD}^{2D}$ ($\Omega \cdot \square^{-1}$) of the channel layer 106 based on the four-probe method;

S25, measuring the length $L_{in}$ from the Ti/Au electrode to the edge of the channel layer 106 (in one embodiment, the length from the Ti/Au electrode at point A in FIG. 8 to the lower edge of the channel layer 106), the diameter $D_{CNT}$ of the metallic SWCNT, the length L and the width W ($\mu m$) of the channel layer 106 between the source electrode 108 and the drain electrode 110;

S26, bring the above measurement results into formula I.

$$R_{tot} = 2R_{nc}^{CNT} + 2R_Q^{CNT} + 2\rho_{CNT}^{on\ SiO_2}L_{in} + \sqrt{2R_t\rho_l}\left(1 - e^{-\frac{W}{L_T}}\right),$$

Wherein, $R_{tot}$ is the resistance between two electrodes provided on the two metallic SWCNTs (one metallic SWCNT is the source electrode 108, and the other metallic SWCNT is the drain electrode 110), the connection line between the two electrodes is parallel to the length direction of the channel layer 106 (that is, $R_{tot}$ is the resistance between the electrodes at points A and B in FIG. 8), and $R_{tot}$ can be directly measured by the power meter (such as a Keithley 2912 high-precision source meter); $R_{nc}^{CNT}$ is a interface contact resistance between the metal SWCNT and the Ti/Au electrode, and can be obtained by the transfer length method; $R_Q^{CNT}$=6.5 k$\Omega$, and $R_Q^{CNT}$ is the quantum resistance of the metallic SWCNT; $\rho_{CNT}^{on\ SiO2}$ is the resistivity of the metallic SWCNT on the silicon dioxide, and can be obtained by the transfer length method; $L_{in}$ is the distance from the Ti/Au electrode to the channel layer 106 (that is, $L_{in}$ is the length from the Ti/Au electrode at point A in FIG. 8 to the lower edge of the channel layer 106), and $L_{in}$ can be obtained by the scanning electron microscopy or the atomic force microscopy; $R_t$=2$r_c$/$D_{CNT}$+$\rho_{TMD}^{2D}$L, $r_c$ is the interface contact resistivity between the metallic SWCNT and the channel layer 106, $D_{CNT}$ is the diameter of the metallic SWCNT, $\rho_{TMD}^{2D}$ is the sheet resistance of the channel layer 106 and can be measured by the four-probe method, L is the length of the channel layer 106 between the source electrode 108 and the drain electrode 110, and can be measured by the scanning electron microscopy or the atomic force microscopy; $\rho_l$=$\rho_{CNT}^{on\ MoS_2}$, $\rho_{CNT}^{on\ MoS_2}$ is the resistivity of the metallic SWCNT on the MoS2 film, and can be obtained by the transfer length method; W is the width of the channel layer 106 and can be measured by the scanning electron microscope or the atomic force microscope); $L_T=\sqrt{R_t/2\rho_l}$; In the formula I, $r_c$ is an unknown value, and the remaining values can be obtained through steps S23 to S25, so that the interface contact resistivity $r_c$ ($\Omega \cdot \mu m^2$) between the SWCNT and the channel layer 106 is finally calculated; and S27, the contact resistance $R_c$ between the metallic SWCNT and the channel layer 106 satisfies the formula: $R_c = r_c/l_c$ ($\Omega \cdot \mu m$), wherein $l_c$ represents the diameter of the metallic SWCNT, thereby obtaining the contact resistance Rc between the metallic SWCNT and the channel layer 106; and the contact resistance between the metallic SWCNT and the channel layer 106 is the interface resistance between the source electrode 108 (or the drain electrode 110) and the channel layer 106 in the field effect transistor 100.

During step S23, in one embodiment, $\rho_{CNT}^{on\ SiO2}$ refers to the resistivity of the metallic SWCNT that is in direct contact with the silicon dioxide, and $\rho_{CNT}^{on\ MoS_2}$ refers to the resistivity of the metallic SWCNT that is in direct contact with the MoS$_2$ film.

The transfer length method is to obtain the channel resistance of the device and the contact resistance between the electrode and the channel by linearly fitting the resistances of devices with different channel lengths. For a long channel CNT transistor, the total resistance between source electrode 108 and drain electrode 110 can be expressed as:

$$R_{CNT} = \rho_{CNT}^{on\ SiO_2} L + 2R_{nc}^{CNT} + R_Q^{CNT},$$

wherein $\rho_{CNT}^{on\ SiO2}$ represents the resistivity of the metallic SWCNT that is in direct contact with silicon dioxide, L represents the length of the channel layer 106 between the source electrode 108 and the drain electrode 110, and $R_{nc}^{CNT}$ represents the contact resistance of interface between the Au/Ti electrode and the metallic SWCNT caused by the structural defects; and $R_Q^{CNT}$ represents the quantum resistance of the metallic SWCNTs, and $R_Q^{CNT} = 6.5$ k$\Omega$.

Figure 13:
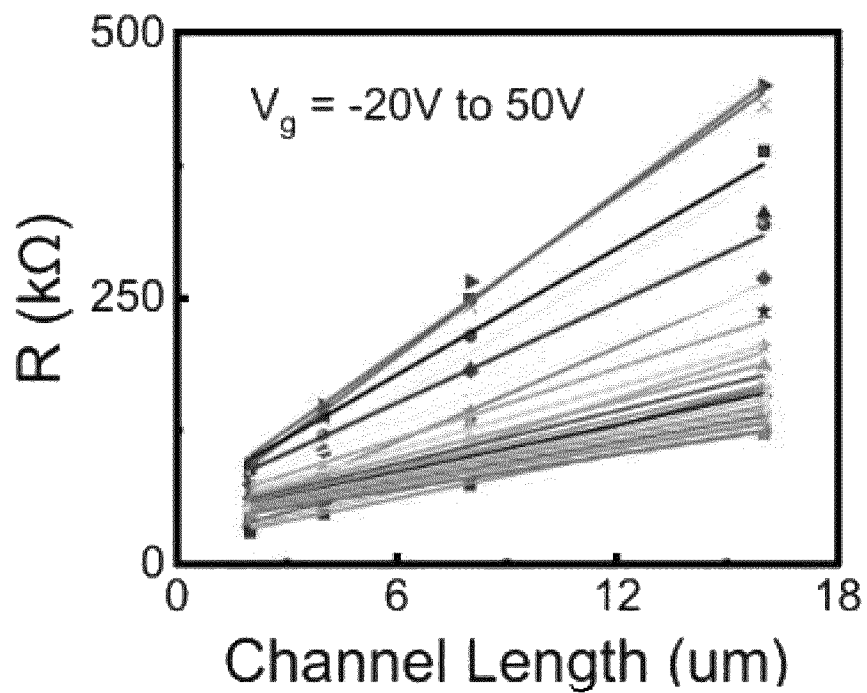
FIG. 13 shows results of analyzing multiple groups of CNT devices by the transfer length method.

During step S23, the transfer characteristic curves of multiple groups of CNT devices (the CNT devices can be formed by the electrodes EF, the electrodes DE, the electrodes CD, the electrodes AG, the electrodes GH, and the electrodes HI) are measured. FIG. 13 is the result of analyzing the multiple groups of CNT devices by the transfer length method, the horizontal axis is the channel length of the device, the vertical axis is the resistance of the device, and the dots and straight lines in different colors represent the measurement results of the devices under different gate voltages. The slope of the fitted line represents $\rho_{CNT}^{on\ SiO_2}$, and the intercept with the vertical axis (x=0) represents $2R_{nc}^{CNT} + R_Q^{CNT}$.

The resistivity $\rho_{CNT}^{on\ SiO_2}$ ($\Omega \cdot \mu m^{-1}$) of the metallic SWCNT on SiO$_2$ and the contact resistance $R_{nc}^{CNT}$ between the metallic Au/Ti and the metallic SWCNT were obtained by the transfer length method. The contact resistance between the metallic SWCNT and each Au/Ti electrode is considered to be the same here. The transfer characteristic curve between the electrodes AC is measured; and the contact resistance between Au/Ti and the metallic SWCNT, the quantum resistance of the metallic SWCNT, and the resistance of the metallic SWCNT on SiO$_2$ are subtracted, to obtain the resistance of the metallic SWCNT on molybdenum disulfide. The resistance of the metallic SWCNT on molybdenum disulfide is divided by the length of the metallic SWCNT on MoS$_2$ to obtain $\rho_{CNT}^{on\ MoS_2}$ ($\Omega \cdot \mu m^{-1}$).

During step S24, the four-probe method is a common method for measuring the sheet resistance of thin films. There are the electrode 1, the electrode 2, the electrode 3, and the electrode 4 in FIG. 8. A constant current $I_{14}$ is applied between the electrode 1 and the electrode 4, and then the voltage $V_{23}$ between the electrode 2 and the electrode 3 is read, so that the channel resistance of the two-dimensional material (molybdenum disulfide in one embodiment) between the electrode 2 and the electrode 3 can be expressed as $R_{23} = V_{23}/I_{12}$. The corresponding sheet resistance can be expressed as $\rho_{TMD}^{2D} = R_{23} W/L$.

Figure 14:
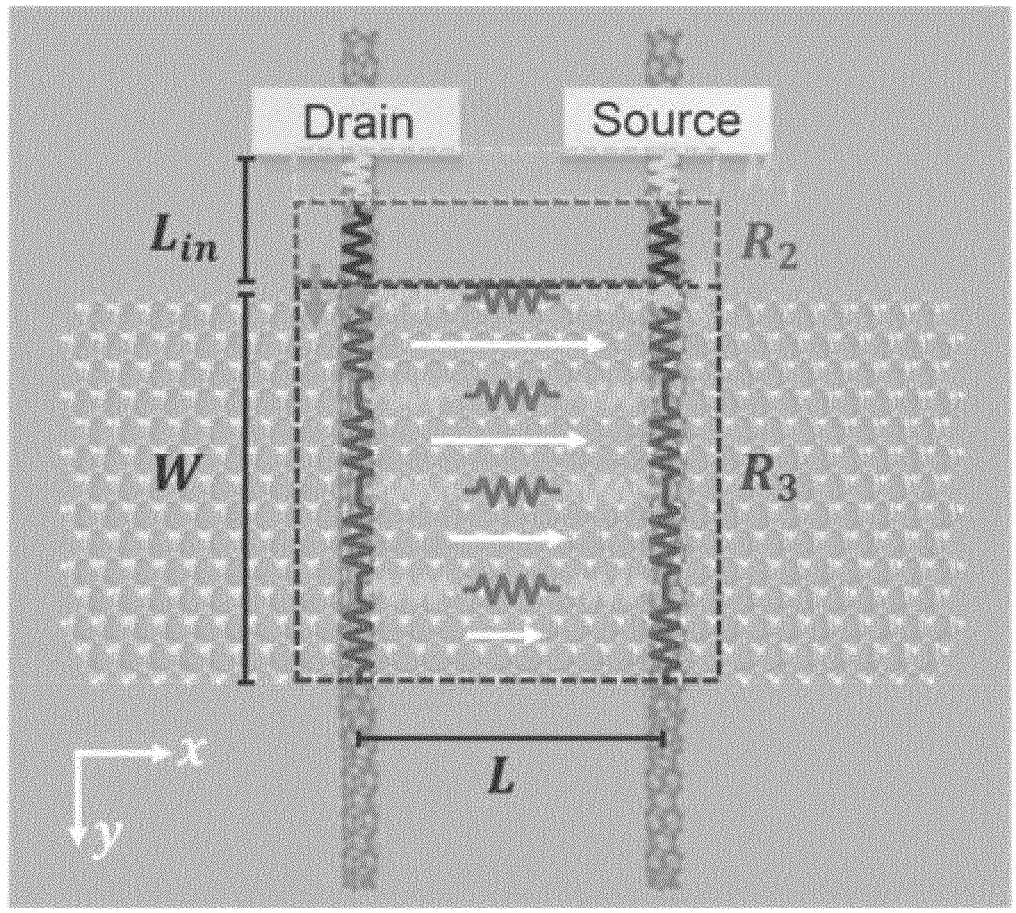
FIG. 14 shows a longitudinal transmission line model used to measure the interface resistance between the source electrode and the channel layer, to measure the interface resistance between the drain electrode and the channel layer in the field effect transistor of FIG. 1.

FIG. 14 shows a longitudinal transmission line model used to measure the interface resistance between the source electrode 108 (or the drain electrode 110) and the channel layer 106 in the field effect transistor 100. It can be seen from FIG. 14 that when the field effect transistor 100 adopts an ultra-short contact, considering the self resistance and contact resistance of the contact material, the potential and current distribution in the channel layer 106 may be uneven. The longitudinal transmission line model is used to model and analyze this situation, and an analytical expression of the equivalent resistance of the field effect transistor 100 under the condition of uneven potential current distribution is given, and the analytical expression is the formula I in the step S26.

Therefore, through the method for measuring the interface resistance between the source electrode 108 (or the drain electrode 110) and the channel layer 106 in the field effect transistor 100, the interface resistance between the source electrode 108 and the channel layer 106, and the interface resistance between the drain electrode 110 and the channel layer 106 can be obtained. Since both the source electrode 108 and the drain electrode 110 in the above method are the metallic SWCNTs, the interface resistance between the metallic SWCNTs and the channel layer 106 can be obtained.

A method for measuring the interface resistance between the source electrode 108 (or the drain electrode 110) and the channel layer 106 in the field effect transistor 100 is described below with a specific embodiment, but is not limited thereto.

Figure 15:
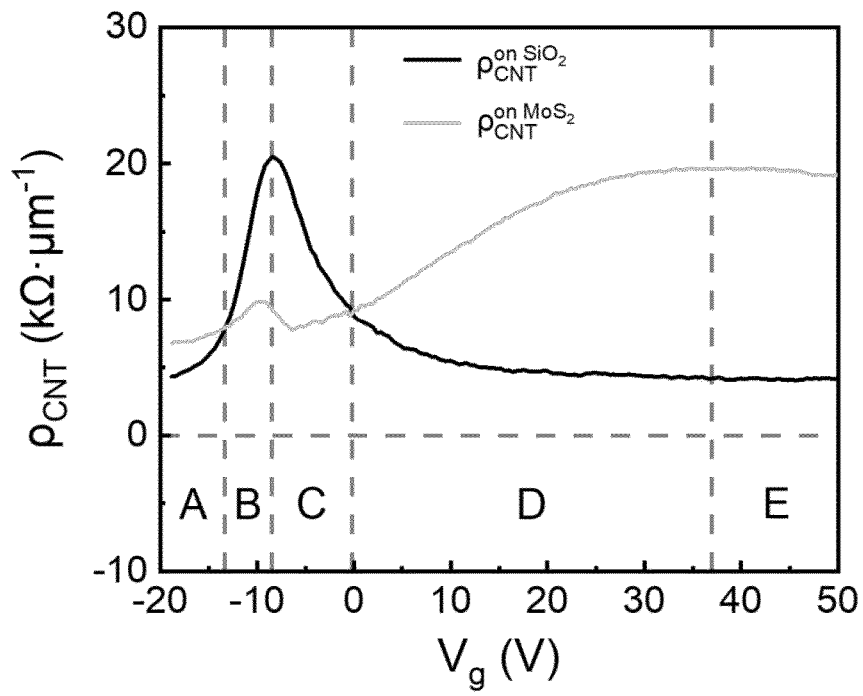
FIG. 15 shows a resistivity-voltage curve of the metallic SWCNT on the silicon dioxide, and the metallic SWCNT on the $MoS_2$ film.
Figure 16:
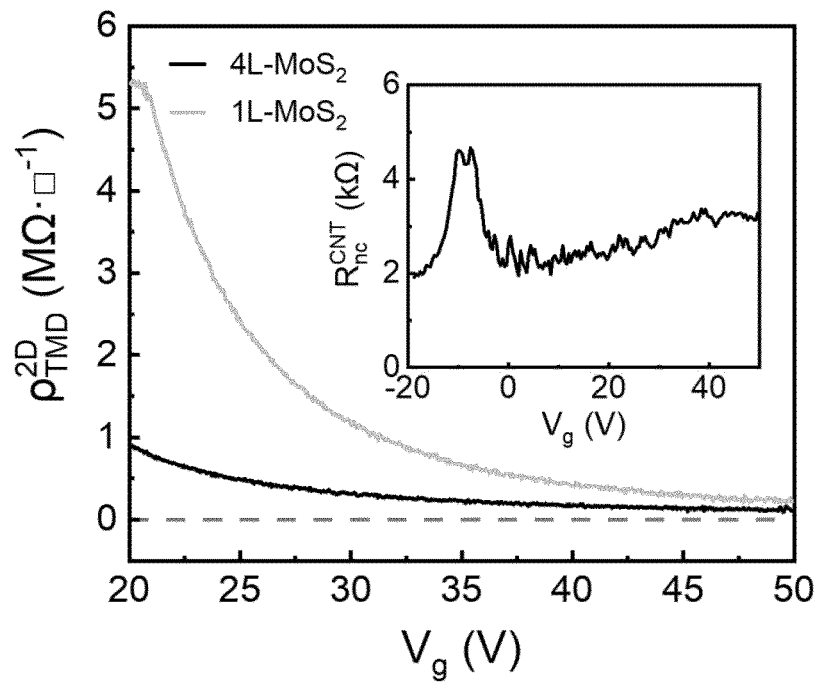
FIG. 16 shows a sheet resistance-voltage curve of the $MoS_2$ film.
Figure 17:
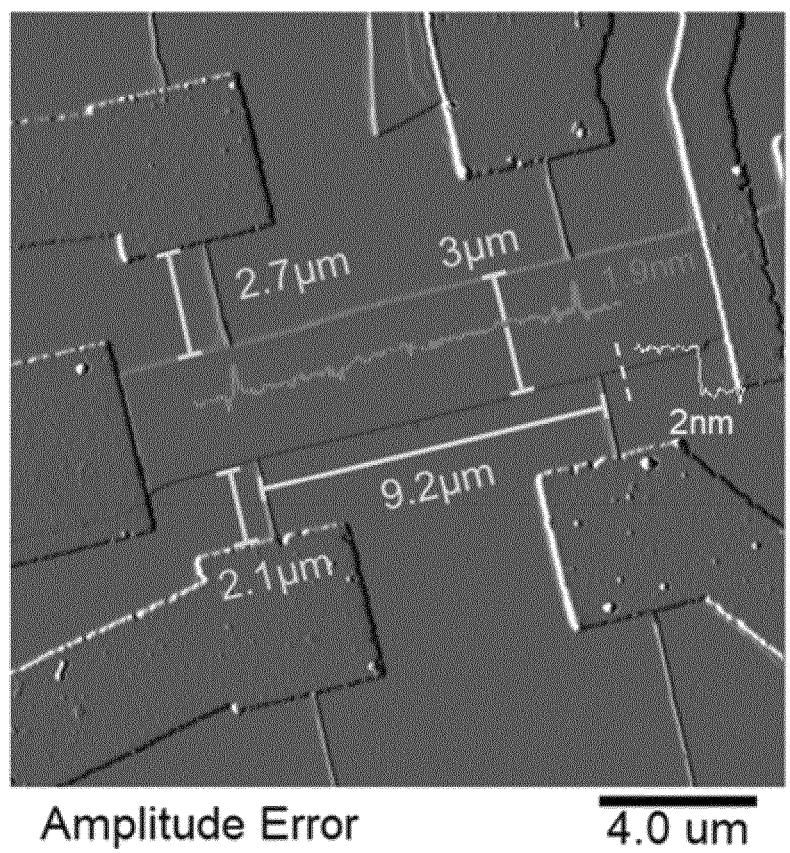
FIG. 17 shows measurement results of each feature length using an atomic force microscope (AFM).

In this specific example, the experimentally measured $\rho_{CNT}^{on\ SiO_2}$, $R_{nc}^{CNT}$, $\rho_{CNT}^{on\ MoS_2}$ and $\rho_{TMD}^{2D}$ are shown in FIGS. 15 and 16. Combined with the measurement results of each characteristic length by the atomic force microscopy (AFM) in FIG. 17, the interface contact resistivity $r_c = 10^{-6}$ $\Omega \cdot cm^2$ between the metallic SWCNT and MoS$_2$ can be calculated according to formula I, as shown in FIG. 12. Therefore, the contact resistance Rc between the metallic SWCNT and MoS$_2$ satisfies the formula: $R_c = r_c/D_{CNT} = 50$ k$\Omega \cdot \mu m$.

The method for measuring the interface resistance between the source electrode 108 (or the drain electrode 110) and the channel layer 106 in the field effect transistor 100 has the following advantages: in the case where the field effect transistor 100 uses a very short SWCNT contact, the resistance of the contact and interconnection parts is not negligible, and the potential and current in the channel layer 106 tend to be unevenly distributed. The traditional four-probe method and transfer length method are not applicable to the measurement extraction of the interface resistance (that is contact resistance) between the source electrode 108 (or drain electrode 110) and the channel layers 106 in this case. Therefore, the present application proposes a "longitudinal transmission line model", which gives the two-terminal resistance of the field effect transistor 100 having extremely short SWCNTs, that is the resistance between the electrode at point A and the electrode at point B in FIG. 8 can be obtained. On this basis, combined with the four-probe method and the transfer length method to extract relevant position parameters, the contact resistance of the field effect transistor 100 can be calculated. That is, the interface resistance between the source electrode 108 (or drain electrode 110) and the channel layer 106 of the field effect transistor 100 can be obtained.

It is to be understood that the above-described embodiments are intended to illustrate rather than limit the disclosure. Any elements described in accordance with any embodiments is understood that they can be used in addition or substituted in other embodiments. Embodiments can also be used together. Variations may be made to the embodiments without departing from the spirit of the disclosure. The above-described embodiments illustrate the scope of the disclosure but do not restrict the scope of the disclosure.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A field effect transistor comprising:
   a gate electrode;
   an insulating layer, wherein the insulating layer is located on a surface of the gate electrode;
   a source electrode;
   a drain electrode; and
   a channel layer, wherein the insulating layer is between the channel layer and the gate electrode, the source electrode and the drain electrode are deposited spaced apart from each other on the channel layer, and the channel layer is between the source and the drain electrodes and the insulating layer;
   wherein each of the source electrode and the drain electrode is a one-dimensional structure with a same chirality.

2. The field effect transistor of claim 1, wherein the channel layer is a molybdenum disulfide film, a tungsten disulfide film, or a tungsten diselenide film.

3. The field effect transistor of claim 1, wherein a material of each of the source electrode and the drain electrode is a metal, an alloy, an indium tin oxide, an antimony tin oxide, a conductive silver paste, a conductive polymer, or a metallic carbon nanotube.

4. The field effect transistor of claim 3, wherein each of the source electrode and the drain electrode is a single carbon nanotube, and the carbon nanotube is a metallic single-walled carbon nanotube.

5. The field effect transistor of claim 4, further comprising a plurality of electrodes, wherein the plurality of electrodes are located on the channel layer, the source electrode, and the drain electrode; and the plurality of electrodes are spaced apart from each other, and distances between adjacent two of the plurality of electrodes are not equal.

6. A field effect transistor comprising:
   a gate electrode;
   an insulating layer, wherein the insulating layer is located on a surface of the gate electrode;
   a first strand of carbon nanotube of carbon and metal atoms arranged in a single-walled structure, the first strand of carbon nanotube being a source electrode;
   a second strand of carbon nanotube of carbon and metal atoms arranged in a single-walled structure, the second strand of carbon nanotube being a drain electrode; and
   a channel layer, wherein the insulating layer is between the channel layer and the gate electrode, and the channel layer is sandwiched between the source and the drain electrodes and the insulating layer;
   wherein each of the source electrode and the drain electrode is a one-dimensional structure with a same chirality.

7. The field effect transistor of claim 6, wherein the channel layer is a molybdenum disulfide film, a tungsten disulfide film, or a tungsten diselenide film.

8. The field effect transistor of claim 6, further comprising a plurality of electrodes, wherein the plurality of electrodes are located on the channel layer, the source electrode, and the drain electrode; and the plurality of electrodes are spaced apart from each other, and distances between adjacent two of the plurality of electrodes are not equal.

9. The field effect transistor of claim 6, wherein each of the source electrode and the drain electrode is a single carbon nanotube, and the carbon nanotube is a metallic single-walled carbon nanotube.

10. A method for making a field effect transistor, the method comprising:
    forming an insulating layer on a surface of a gate;
    forming a channel layer on a surface of an insulating layer, the insulating layer being sandwiched between the channel layer and the gate;
    placing two one-dimensional structures spaced apart from each other on a surface of the channel layer, the channel layer being sandwiched between the two one-dimensional structure and the insulating layer, wherein the two one-dimensional structures are electrically conductive; and
    forming a plurality of electrodes on the two one-dimensional structures and on the surface of the channel layer where the two one-dimensional structures are located, wherein the plurality of electrodes are spaced apart from each other.

11. The method of claim 10, wherein the channel layer is a molybdenum disulfide film, a tungsten disulfide film, or a tungsten diselenide film.

12. The method of claim 10, wherein each of the two one-dimensional structures is a single carbon nanotube, and the carbon nanotube is a metallic single-walled carbon nanotube.

13. The method of claim 12, further comprising making the two one-dimensional structures by:
    growing carbon nanotubes;
    placing the carbon nanotubes in a sulfur vapor to form sulfur particles on the carbon nanotubes;
    selecting, from the sulfurized carbon nanotubes, carbon nanotubes having a single walled structure;
    detecting electrical conductivities of the single-walled carbon nanotubes, and selecting single-walled carbon nanotubes which exhibit electrical conductivities as the metalized single-walled carbon nanotubes; and
    annealing to remove the sulfur particles from the metalized single-walled carbon nanotubes.

14. The method of claim 13, wherein during detecting the electrical conductivities of the single-walled carbon nanotubes, when an electrical current of the single-walled carbon nanotubes is greater than or equal to 1 nanoampere at a voltage of 1 volt, the single-walled carbon nanotube is selected as the metalized single-walled carbon nanotube.

15. The method of claim 10, further comprising placing the gate electrode on an insulating substrate, wherein the insulating substrate is a base of a large scale integrated circuits.

* * * * *